United States Patent [19]

Mihara et al.

[11] Patent Number: 5,049,953
[45] Date of Patent: Sep. 17, 1991

[54] SCHOTTKY TUNNEL TRANSISTOR DEVICE

[75] Inventors: Teruyoshi Mihara; Kenji Yao, both of Yokosuka; Tsutomu Matsushita, Yokohama; Yoshinori Murakami, Yokosuka, all of Japan

[73] Assignee: Nissan Motor Co., Ltd., Yokohama, Japan

[21] Appl. No.: 465,750

[22] Filed: Jan. 18, 1990

[30] Foreign Application Priority Data

Jan. 18, 1989 [JP] Japan .................................. 1-7764

[51] Int. Cl.⁵ ................... H01L 29/48; H01L 29/10; H01L 27/02; H01L 29/34
[52] U.S. Cl. .................................. 357/15; 357/23.4; 357/41; 357/52; 357/86
[58] Field of Search ............... 357/15, 23.4, 41, 52, 357/86

[56] References Cited

U.S. PATENT DOCUMENTS 4,631,563 12/1986 Iizuka .................................. 357/23.7
4,823,172 4/1989 Mihara ................................. 357/15
4,881,112 11/1989 Matsushita ........................... 357/43

FOREIGN PATENT DOCUMENTS 62-274775 11/1987 Japan ..................................... 357/15
2103419 8/1981 United Kingdom ............... 357/23.4

Primary Examiner—Andrew J. James
Assistant Examiner—Cynthia S. Deal
Attorney, Agent, or Firm—Foley & Lardner

[57] ABSTRACT

A semiconductor device includes a semiconductor substrate of a first conductivity type, in which a drain region is formed in the substrate, and a gate electrode is formed on the surface of the substrate via an insulating film formed thereon. A Schottky metal as a source region is formed in the surface of the substrate away from the drain region, the Schottky metal and the substrate constituting a Schottky junction at an interface therebetween near the gate electrode. A shield layer of a second conductivity type is interposed between the Schottky metal and the substrate except in the Schottky junction. The gate electrode controls tunnel current at the Schottky junction.

9 Claims, 8 Drawing Sheets

FIG. 1 (a) PRIOR ART
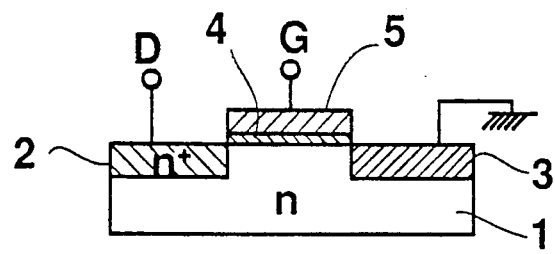
FIG. 1 (b) PRIOR ART  $V_G=0$  $V_D=0$
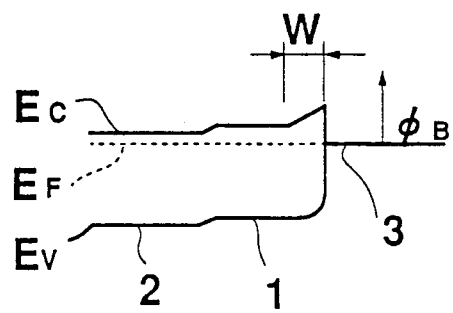
FIG. 1 (c) PRIOR ART  $V_G=0$  $V_D>0$
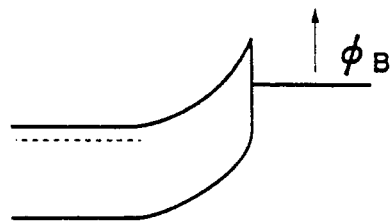
FIG. 1 (d) PRIOR ART  $V_G>0$  $V_D>0$
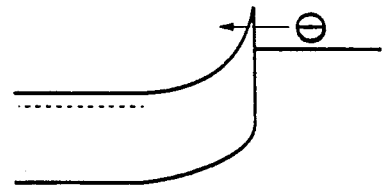
FIG. 1 (e) PRIOR ART  $V_G=0$  $V_D<0$
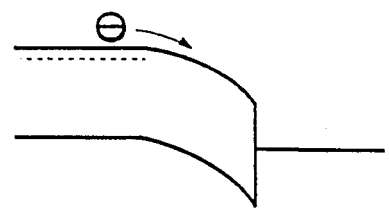

$V_G = 0$
$V_D > 0$

← n → p ← METAL →
$V_G = 0$
$V_D > 0$

FIG.8 (a)
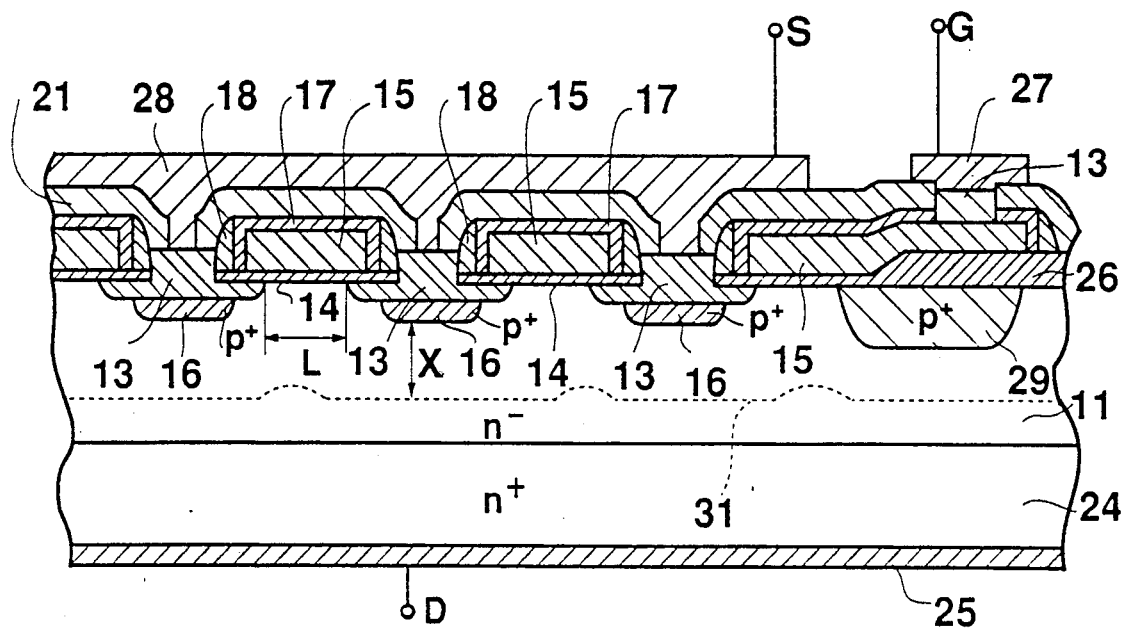
FIG.8 (b)
FIG.8 (c)
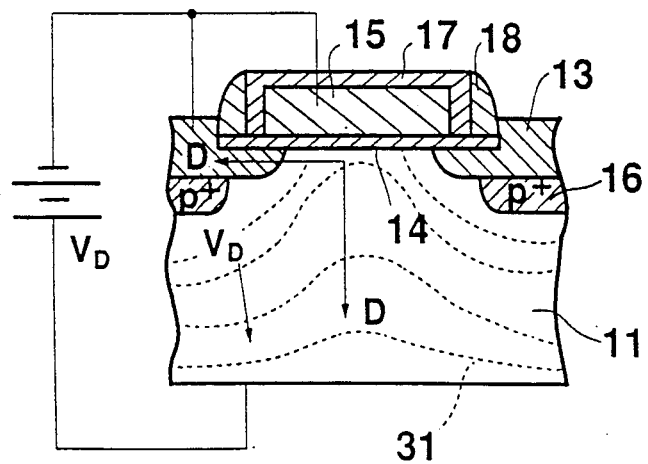

FIG.9 (a)
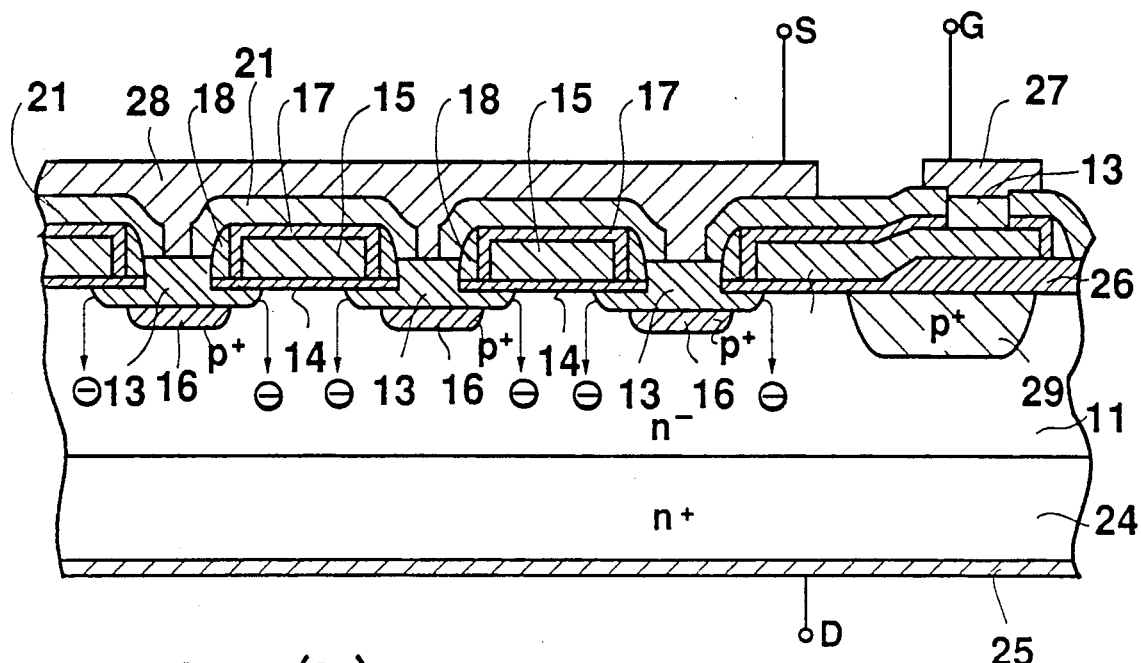
FIG.9 (b)
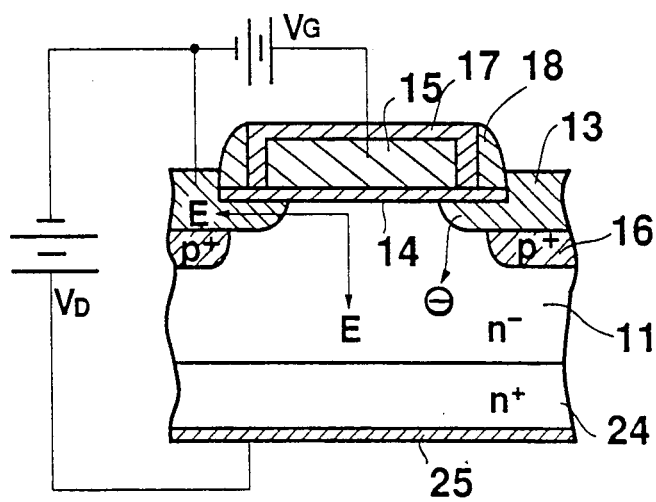
FIG.9 (c)

SCHOTTKY TUNNEL TRANSISTOR DEVICE

BACKGROUND OF THE INVENTION

1. Field of the Invention

The present invention relates to a semiconductor device in which a thickness of an energy barrier of a Schottky junction is modulated by an electric field of an insulated gate electrode to control a tunnel phenomenon, thereby controlling a main current.

2. Description of the Background Art

In FIG. 1, there is shown a conventional semiconductor device such as a Schottky tunnel transistor, a thickness of an energy barrier of a Schottky junction is modulated by an electric field of an insulated gate electrode to control a tunnel phenomenon, thereby controlling a main current, as disclosed in Japanese Patent Laid-Open Specification No. 62-274775.

In FIG. 1a, an $n^+$-type drain region 2 is formed in the surface area of an n-type silicon semiconductor substrate 1, and apart from the drain region 2 a Schottky metal 3 for acting as a source region is also embedded in the surface area of the substrate 1 so as to form a Schottky junction between the substrate 1 and the Schottky metal 3. A gate electrode 5 is formed on the surface of the substrate 1 via a gate insulating film 4 formed thereon between the drain region 2 and the Schottky metal source region 3.

In FIGS. 1b to 1c, there are shown energy band structures of the Schottky junction and the bias states against the $n^+$-type drain region 2 and the gate electrode 5 in the surface area of the n-type silicon semiconductor substrate 1 of the Schottky tunnel transistor shown in FIG. 1a.

As shown in FIG. 1b, when both gate voltage $V_G$ and drain voltage $V_D$ are zero, the thickness W of the Schottky barrier is thick, and thus there is no electron flow between the drain and the source. In FIG. 1c, when $V_G$=zero and $V_D$>zero, the thickness W of the Schottky barrier is thick, and a reverse bias voltage is applied to the Schottky junction, with the result of no electron flow between the drain and the source. In FIG. 1d, when $V_G$>zero, the energy band is largely bent by the electric field of the gate electrode 5, and the thickness W of the Schottky barrier becomes thin. Hence, when $V_D$>zero, electrons flow from the Schottky metal 3 to the semiconductor substrate 1 through the Schottky junction therebetween by the tunnel effect, and thus a tunnel current flows from the drain region 2 to the Schottky metal source region 3 through the Schottky junction. In FIG. 1e, when $V_G$=zero and $V_D$<zero, a forward bias voltage is applied to the Schottky junction. As a result, a lot of electrons can move from the semiconductor substrate 1 to the Schottky metal 3, and thus an electric current flows therebetween in the forward-direction.

In this case, the tunnel current can be changed by adjusting the gate voltage $V_G$. In a Schottky tunnel transistor utilizing this phenomenon, no punch-through occurs unlike a usual MOSFET, and thus the Schottky tunnel transistor is desired to be employed in a miniaturized device in the future.

However, in the abovementioned Schottky transistor, there is a problem in that a leak current is very large. This is explained as follows. In the conventional MOSFET, a barrier thickness of a pn junction between a source region and a substrate is thick, such as approximately 1000 Å. When the gate voltage is zero and a reverse bias is applied to the drain only a diffusion current flows through the pn junction, and the leak current flowing through the junction is very small. On the other hand, in the Schottky tunnel transistor, when $V_G$=0 and a reverse bias is applied to the drain as shown in FIG. 1c, the leak current IL of the Schottky junction is due to a thermionic emission beyond the triangular potential barrier height $\phi B$ and thus IL exponentially increases with the temperature according to the following formula, $$IL^b \approx \exp(-\phi B/kT)$$

wherein k is boltzmann's constant and T is an absolute temperature.

However, in a conventional Schottky tunnel transistor, although the effective source region, of which the tunnel current is affected by the gate voltage $V_G$, is only a part of the Schottky junction near the gate electrode, the Schottky junctions are widely formed in the area where the substrate 1 and the Schottky metal 3 contact each other. Accordingly, when the temperature and/or the drain voltage $V_D$ increase, the leak current of the Schottky junctions becomes many times larger than that of the effective source region, and furthermore, since the drain voltage is directly applied to the Schottky junction, the curve of the triangular potential at the Schottky junction becomes sharp, thereby equivalently bringing about the depression of the Schottky barrier $\phi B$. As a result, in this respect, the leak current increases, and thus the blocking voltage is reduced.

SUMMARY OF THE INVENTION

Accordingly, it is an object of the present invention to provide a semiconductor device, free from the aforementioned disadvantages of the prior art, which is capable of reducing leak current to improve a static current-voltage characteristic.

In accordance with one aspect of the present invention, there is provided a semiconductor device, comprising a semiconductor substrate of a first conductivity type, the substrate having a first surface and including a drain region, a gate electrode formed on the first surface of the substrate via an insulating film formed thereon, a Schottky metal formed as a source region in the first surface of the substrate away from the drain region, the Schottky metal and the substrate constituting a Schottky junction at an interface therebetween near the gate electrode, and a shield layer of a second conductivity type different from the first conductitive type, the shield layer being interposed between the Schottky metal and the substrate except the Schottky junction, the gate electrode controlling a tunnel current at the Schottky junction.

BRIEF DESCRIPTION OF THE DRAWINGS

FIG. 1 illustrates a conventional Schottky tunnel transistor, FIG. 1a is a longitudinal cross section and FIGS. 1b to 1e schematically show energy bands thereof;

3

Figure 4:
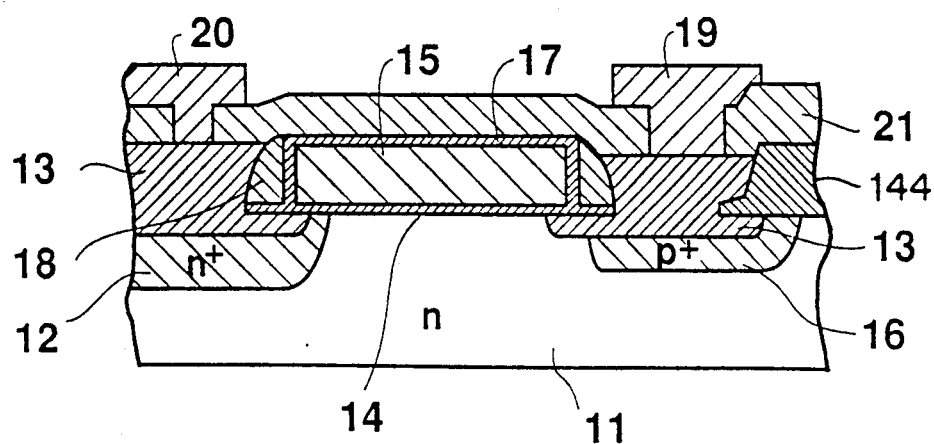
Figure 6:
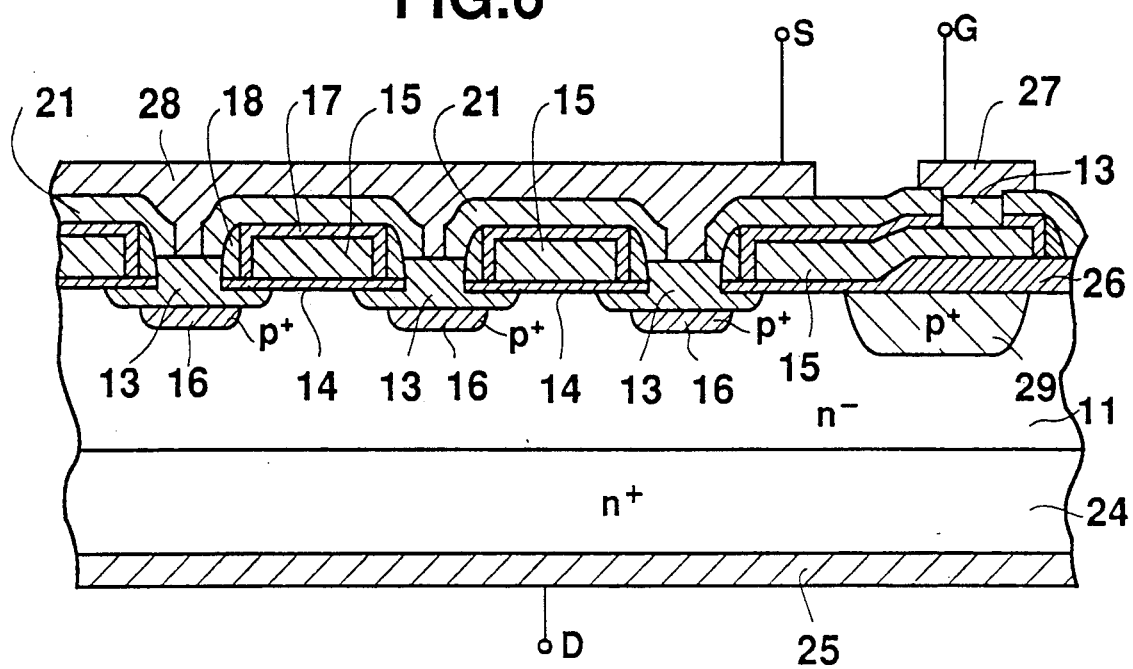
Figure 7:
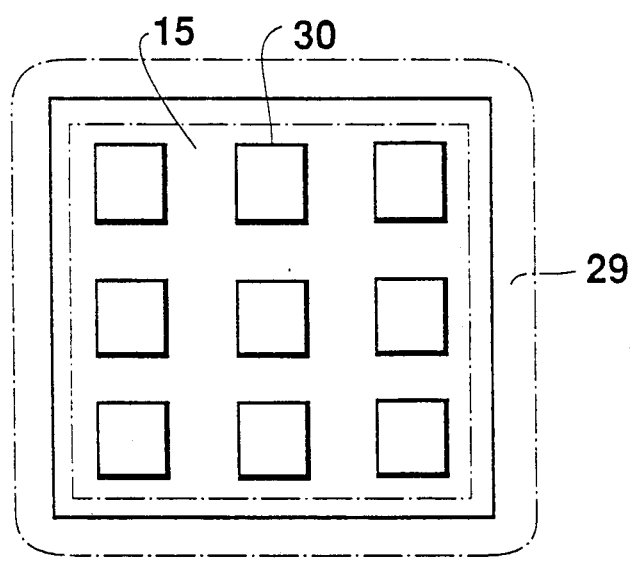
Figure 7:
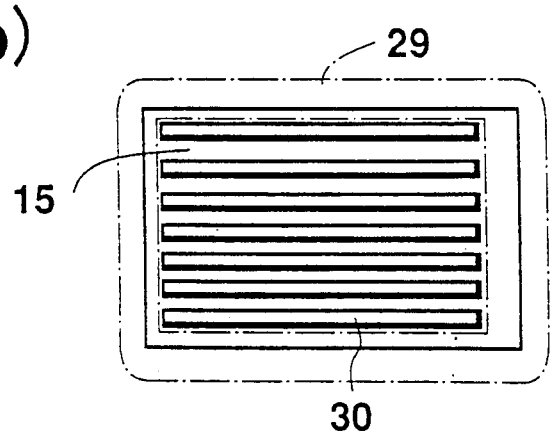
Figure 10:
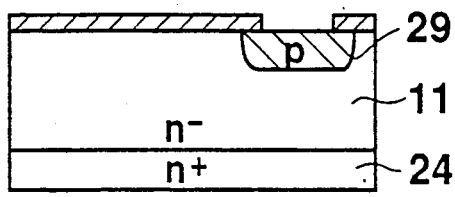
Figure 10:
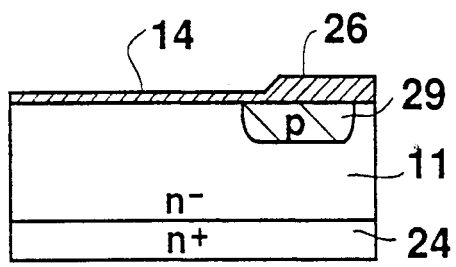
Figure 10:
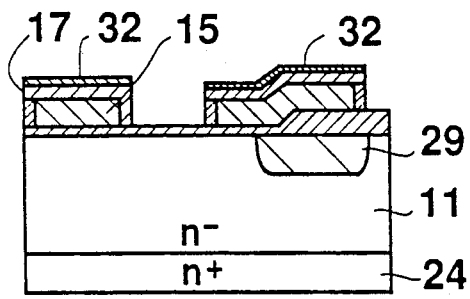
Figure 10:
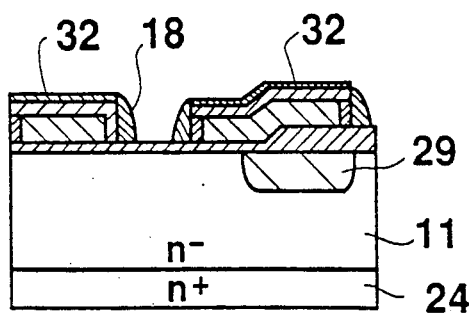
Figure 10:
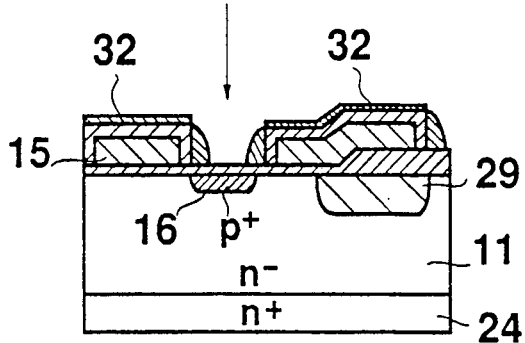
Figure 10:
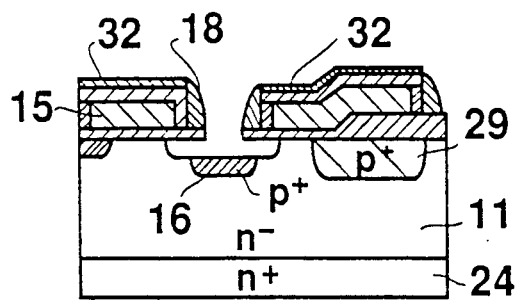
Figure 10:
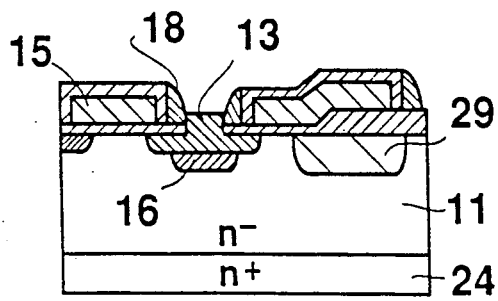
Figure 11:
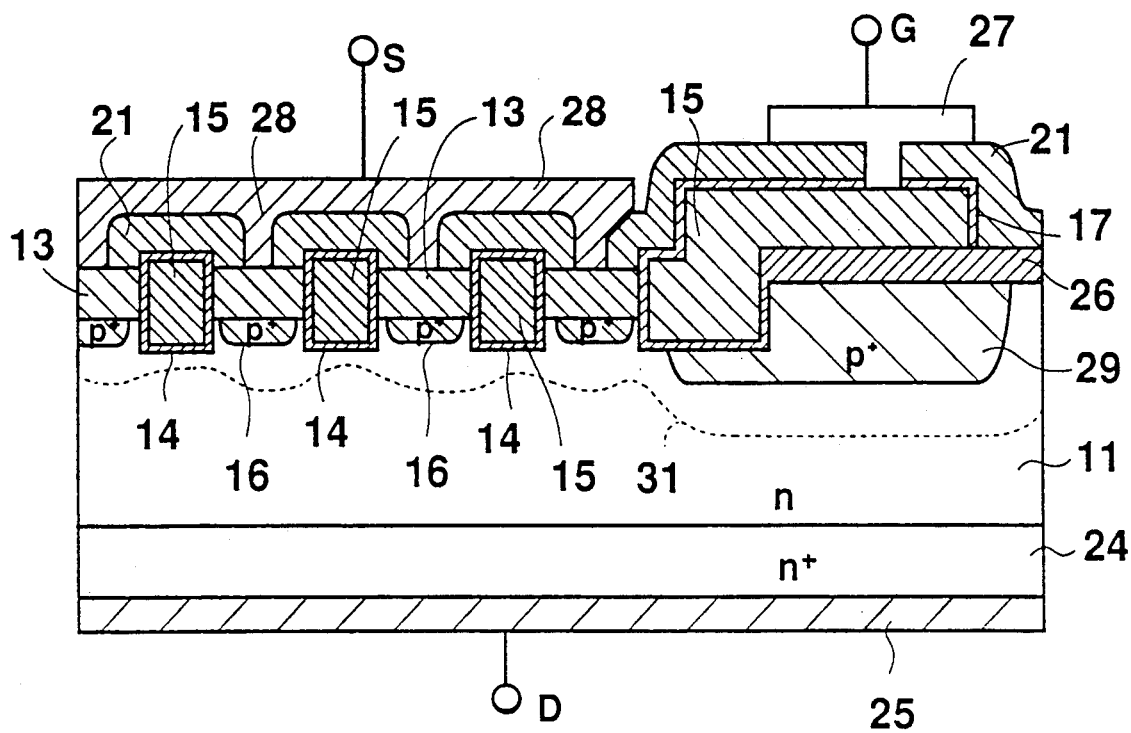
Figure 12:
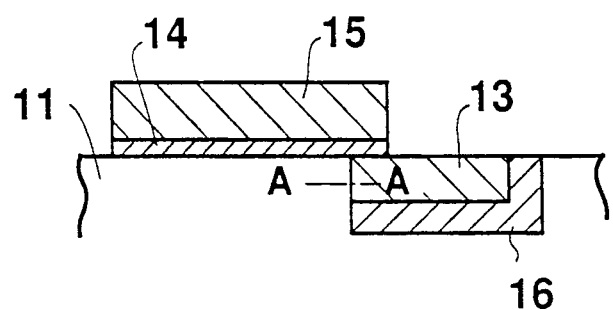
Figure 12:
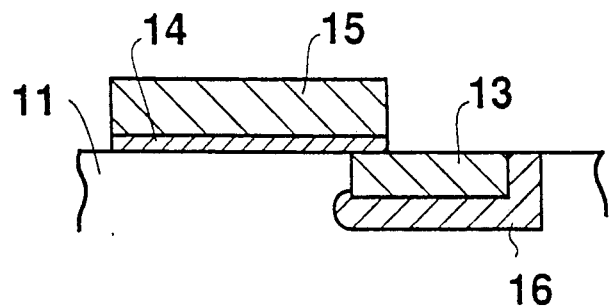

FIG. 4 is a longitudinal cross section of a first embodiment of a semiconductor device according to the present invention;

FIGS. 5a to 5e are longitudinal cross sections showing a method for producing the device shown in FIG. 4;

FIG. 6 is a longitudinal cross section of a second embodiment of a semiconductor device according to the present invention;

FIGS. 7a and 7b are elevational views illustrating cell patterns of the device shown in FIG. 6;

FIGS. 8a to 8c are schematic views for explaining the off-state of the device shown in FIG. 6;

FIGS. 9a to 9c are schematic views for explaining the on state of the device shown in FIG. 6;

FIGS. 10a to 10g are longitudinal cross sections showing a method for producing the device shown in FIG. 6;

FIG. 11 is a longitudinal cross section of a third embodiment of a semiconductor device according to the present invention; and FIGS. 12a and 12b are fragmentary longitudinal cross sections of a fourth embodiment of a semiconductor device according to the present invention.

DESCRIPTION OF THE PREFERRED EMBODIMENTS

Figure 2:
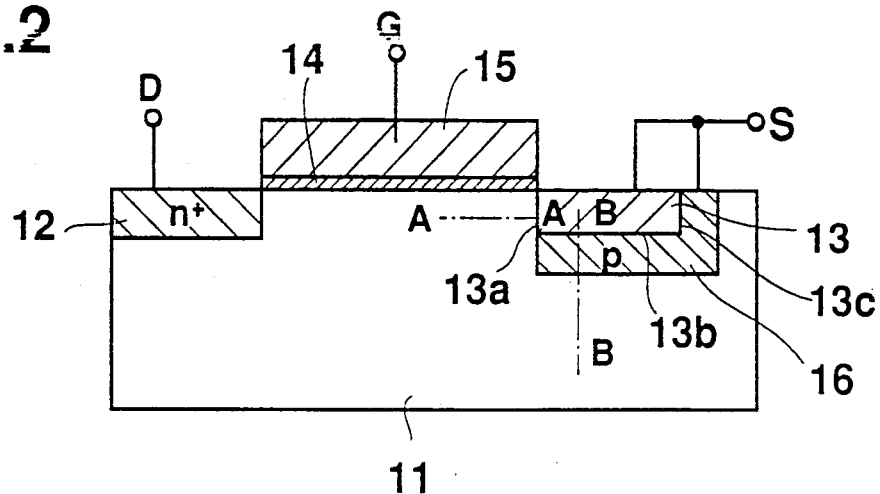
FIG. 2 is a schematic longitudinal cross section of a principal structure of a semiconductor device according to the present invention.
Figure 5:
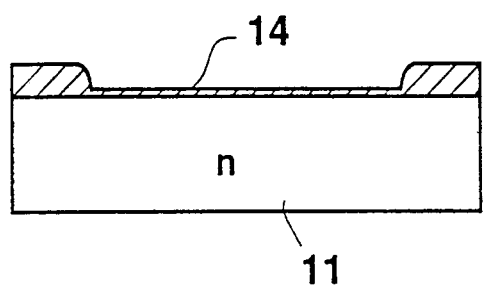
Figure 5:
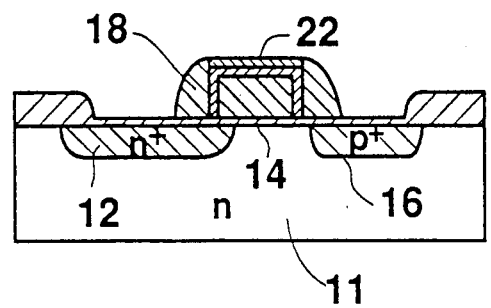
Figure 5:
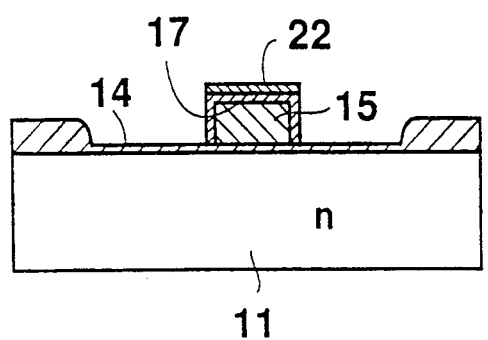
Figure 5:
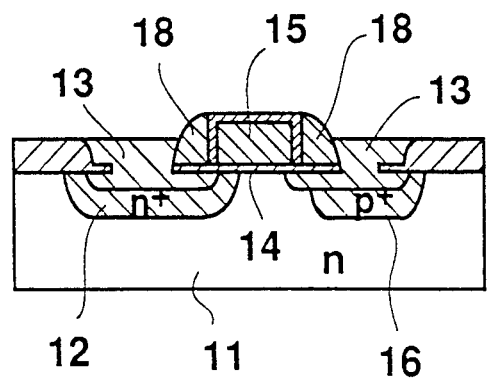
Figure 5:
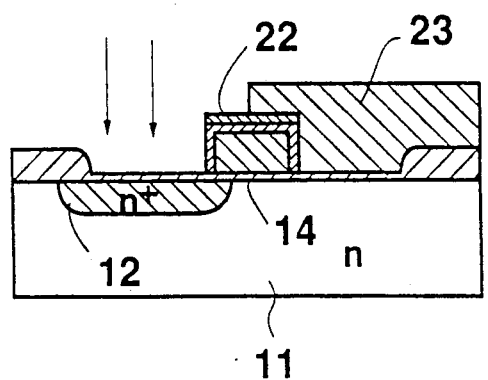

Referring now to the drawings, wherein like reference characters designate like or corresponding parts throughout the several views and thus the repeated description thereof may be omitted for the brevity, there is shown in FIGS. 2 and 5 the first embodiment of a semiconductor device such as a Schottky tunnel transistor according to the present invention.

Figure 3:
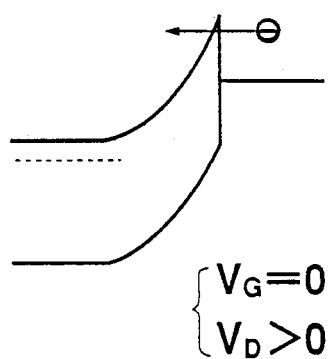
FIGS. 3a and 3b schematically show energy bands of the Schottky junction of the device shown in FIG. 2.
Figure 3:
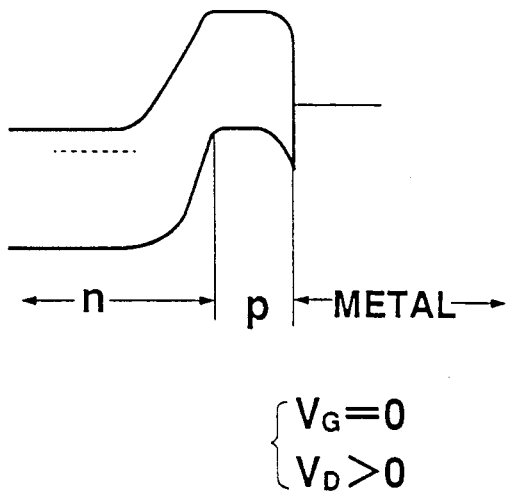

The principal structure and functions of a Schottky tunnel transistor according to the present invention will be described in connection with FIGS. 2 and 3.

As shown in FIG. 2, in the Schottky tunnel transistor, an n+-type drain region 12 is formed in the surface area of an n-type silicon semiconductor substrate 11, and a Schottky metal 13 functioning as a source region is also formed on the surface area of the substrate 11, away from the drain region 12, to form a Schottky junction between the Schottky metal 13 and the substrate 11. A gate electrode 15 is formed on the surface of the substrate 11 via a gate insulating film 14 formed thereon between the drain region 12 and the Schottky metal source region 13. A p-type shield diffusion layer 16 is interposed between the substrate 11 and the Schottky metal 13 except a part affected or controlled by the electric field of the gate electrode 15 to form a channel region or channel equivalent region, i.e., one side wall 13a of the Schottky metal 13 in the vicinity of the gate insulating film 14. That is, in FIG. 2, the shield diffusion layer 16 is inserted between the substrate 11 and the Schottky metal 13 at the bottom 13b and the right side wall 13c except the left side wall 13a.

The operation of the above described Schottky tunnel transistor will be described. FIGS. 3a and 3b illustrate the energy bands of the Schottky junction between the substrate 11 and the Schottky metal, taken along the line A—A, and the pn junction between the n-type semiconductor substrate 11 and the p-type shield diffusion layer 16, taken along the line B—B.

First, at the Schottky junction along the line A—A, as shown in FIG. 3a, when the gate voltage $V_G=0$ and the drain voltage $V_D>0$, that is, a reverse bias is applied to the Schottky junction in the off-state, the tunnel current as the leak current flows through the Schottky junction via the triangular potential thereof. At the Schottky edge, in the presence of the shield diffusion layer 16 the curvature of the depletion layer is enlarged and the concentrating of the electric field is moderated. Further, the Schottky junction area is small and thus the leak current is almost a negligible level. When $V_B>0$ and $V_D>0$, the triangular potential becomes sharp and the large tunnel current flows through the Schottky junction to be in the on-state. Also, the the tunnel current amount is changed by the gate voltage $V_G$.

Secondly, at the pn junction along the line B—B, as shown in FIG. 3b, the junction between the Schottky metal 13 and the p-type shield diffusion layer 16 constitutes an ohmic contact, and thus no triangular potential occurs, with the result of no tunnel current flow. In the pn junction between the substrate 11 and the shield diffusion layer 16, the leak current flows, which is, however, a low level causing almost no problem, like a usual pn junction. This leak current level is also low in a similar manner even when the drain voltage $V_D$ is raised.

In this case, as described above, by interposing the shield diffusion layer 16 having a different conductivity type from that of the semiconductor substrate 11 between the substrate and the Schottky metal 13 except the channel equivalent region affected or controlled by the electric field of the gate electrode 15 in the vicinity thereto, the Schottky metal 13 is shielded by the shield diffusion layer 16 except the channel equivalent region, and the leak path of the interface between the substrate 11 and the Schottky metal 13 except the channel equivalent region can almost be cut off to largely reduce the leak current. Furthermore, the leak current can not be significantly influenced by the temperature characteristics and the drain voltage $V_D$.

In FIG. 4, there is shown the first embodiment of the Schottky tunnel transistor according to the present invention.

An n+-type drain region 12 and a p+-type shield diffusion layer 16 are formed in the surface area of an n-type low concentration silicon semiconductor substrate 11 at a certain distance away from each other, and a Schottky metal 13 such as tungsten (W), separated into two portions, is formed on the upper surface of the drain region 12 and the shield diffusion layer 16. A gate electrode 15 of polycrystalline silicon is formed on the surface of the substrate 11 via an gate insulating film 14 interposed between the drain region 12 or one Schottky metal portion 13 and the other Schottky metal portion 13 or the shield diffusion layer 16. In this case, a part of the Schottky metal 13 is projected transversely right under the gate insulating film 14 into the substrate 11 to effect a direct contact therewith in the vicinity of the gate electrode 15 so as to receive the electric field thereof, and the major part of the Schottky metal 13 is shielded by the drain region 12 and the shield diffusion layer 16 interposed between the substrate 11 and the Schottky metal 13 so as to separate the Schottky metal 13 from the substrate 11.

The gate electrode 15 is covered by an insulating film 17 on the top and side walls, and a gate side wall insulating film 18 surrounds the side walls of the insulating film 17. A source electrode 19 and a drain electrode 20 are connected to the Schottky metal 13 and the drain region 12 directly and indirectly via the Schottky metal 13, respectively, thereby obtaining a Schottky tunnel transistor. The entire surface of the obtained Schottky tunnel transistor is covered by an interlayer insulating film 21. In this case, the drain electrode 20 is connected to the drain region 12 via one Schottky metal 13 used as only a coupling metal.

In the above described Schottky tunnel transistor, the Schottky metal source region 13 projects right under the gate electrode 15 via the gate insulating film 14. In a Schottky tunnel transistor, since a thickness of a Schottky barrier is modulated by a gate voltage, in general, it is desirable that there is no offset between the gate electrode 15 and the Schottky junction. In this embodiment, as described above, the offset is zero, and hence the gate voltage directly affects the Schottky junction through the gate insulating film 14 to diminish the on-resistance to a very small value. Further, the p+-type shield diffusion layer 16 is formed in the self-alingned manner by masking the gate side wall insulating film 18, as hereinafter described in detail, in order to cover the Schottky metal 13 at the junction between the Schottky metal 13 and the substrate 11 except the channel equivalent region, resulting in a minimum leak current at the Schottky junction.

In FIGS. 5a to 5e, a method for producing the Schottky tunnel transistor shown in FIG. 4 will now be described in detail.

In FIG. 5a, a silicon oxide (SiO$_2$) film for forming the gate insulating film 14 is grown on the surface of the n-type silicon semiconductor substrate 11 by thermal oxidation such that the thickness of the silicon oxide 14 is thick except in the device formation area.

In FIG. 5b, a polycrystalline silicon film for forming the gate electrode 15 is deposited on the silicon oxide film 14, and then another silicon oxide film for forming the insulating film 17 is grown in the surface of the polycrystalline silicon film. A Si$_3$N$_4$ masking film 22 for use in effecting the oxidation and the ion doping is deposited on the silicon oxide 17 formed on the polycrystalline silicon film. Then, the obtained laminate film of the polycrystalline silicon film is patterned by dry etching, and then thermal oxidation of the side walls of the patterned polycrystalline silicon film is again carried out in the same manner as described above to form the silicon oxide film 17 on the side walls of the polycrystalline silicon film to obtain the insulated gate electrode 15.

In FIG. 5c, a photoresist film 23 is formed on the right half surface of the substrate 11, and the n+-type drain region 12 is formed in the left surface area of the substrate 11 by doping an n+-type impurity.

In FIG. 5d, the silicon oxide film is deposited on the entire surface of the substrate 11 by the CVD method, and then is removed except for the gate side wall insulating film 18 by the RIE (reactive ion etching) method. Then, by using the the gate side wall insulating film 18 and the gate electrode portion as the mask, the boron ion B+ is doped in the right side surface of the substrate 11 to form the p+-type shield diffusion layer 16 in the surface area of the substrate 11.

In FIG. 5c, by using the gate side wall insulating film 18 as the mask, openings are formed in the thin silicon oxide film 14 above the drain region 12 and the shield diffusion layer 16, and then the Schottky metal 13 such as tungsten is selectively grown in the upper portions thereof and above the thin silicon oxide film 14 to the height of approximately the upper level of the thick silicon oxide film 14. In this Schottky metal deposition, by properly controlling the growing conditions, the Schottky metal is allowed to project transversely into the substrate 11 right under the gate electrode 15 via the gate insulating film 14. In this case, since the tungsten can not react on the silicon oxide but react only on the silicon, the form of the Schottky metal 13 shown in FIG. 5e can be obtained.

Then, a PSC film as the interlayer insulating film 21 is deposited over the entire surface of the substrate. Next, contact holes are opened in the PSC film, and the source electrode 19 and the drain electrode 20 are bonded to the right side Schottky metal source region 13 and the drain region 12 via the left side Schottky metal 13, respectively, to obtain the Schottky tunnel transistor shown in FIG. 4.

In FIGS. 6 to 10, there is shown the second embodiment of the Schottky tunnel transistor according to the present invention. In this embodiment, the Schottky tunnel transistor is a vertical type suitable for a high blocking voltage and a large current capacity.

As shown in FIG. 6, an n−-type low concentration region 11 is formed on an n+-type silicon semiconductor substrate 24. In this embodiment, a plurality of insulated gates including gate insulating films 14, gate electrodes 15 and insulating films 17, p+-type shield diffusion layers 16, gate side wall insulating films 18, Schottky metals 13 and interlayer insulating film 21 are formed in the surface area of the low concentration region 11 in the same manner as those in the first embodiment shown in FIG. 4, and a drain electrode 25 is formed on the back surface of the substrate 24. A field insulating film 26 is integrally connected to the gate insulating film 14 in the right side end, and a gate electrode pad 27 and a source electrode 28 are connected to the gate electrodes 15 and the Schottky metals 13, respectively, indirectly via the Schottky metal 13 and directly in the same manner as those in the first embodiment described above. A field ring 29 is provided under the field insulating film 26 and the gate insulating film 14 integrally connected thereto in the outermost portion of the surface area of the substrate 11.

In this embodiment, the shield diffusion layers 16 are extended widely under the entire bottom portions of the Schottky metals 13 so as to project deeply into the low concentration region 11. The insulated gates including the gate electrodes 15 regularly surround the Schottky metals 13. One unit is composed of one insulated gate including the gate electrode 15 and the gate insulating film 14, and the corresponding Schottky metal 13 along with the shield diffusion layer 16 covering the Schottky metal 13. One unit transistor or one cell 30 includes a plurality of units, such as a group of the insulated gates including the gate electrodes 15 and the corresponding Schottky metals 13 and shield diffusion layers 16, surrounded by the insulated gates. A plurality of cells 30 is connected in parallel with one another so as to receive the large current.

In FIGS. 7a and 7b, there are shown cell patterns such as a mesh form cell pattern and a stripe form cell pattern, respectively. Of course, the cell patterns are not restricted to these patterns, and a variety of cell patterns can be possible, for instance, polygons, circle and so forth. By forming the cell pattern, the width of the channel region of the Schottky junctions can be increased to reduce the on-resistance and to enable to receive the large current. The periphery of the cell groups is surrounded by the field ring 29 for preventing the concentration of the electric field to the peripheral cells.

Operation of the above described Schottky tunnel transistor will be described in detail in connection with FIGS. 8 and 9.

First, the off-state will be explained with reference to FIGS. 8a to 8c. When $V_D>0$ and $V_G \leq 0$, the state is off, and the depletion layer 31 is deep-extended in the low concentration region 11, as shown in FIG. 8a. Hence, no electron is emitted from the Schottky metal 13, as shown in the potential figure of FIG. 8c. In the case where the interval L between the adjacent two Schottky metals 13 in the cell 30 is determined to sufficiently small such as $L<X/2$ with respect to the width X of the depletion layer 31 extending at the necessary blocking voltage, when a high voltage is applied to the drain electrode 25, as shown in FIG. 8b, the surface layer forming the channel region is completely depleted to moderate the surface electric field. Accordingly, the increase of the leak current near the channel region and depression of the blocking voltage can be effectively prevented. The deeper the $p^+$-type shield diffusion layers 16 extend, the longer the depletion layer 31 can be extended in the bulk of the low concentration region 11. This is an advantage for the blocking voltage. However, the same effect can be obtained by minimizing the cells 30 to reduce the length L between the adjacent Schottky metals 13. The field ring 29 surrounding the periphery of the groups of cells 30 is provided to allow the depletion layer 31 to be ended in moderate curvature, and hence double or triple field rings may be formed, as occasion demands.

Secondly, the on-state will be described in connection with FIGS. 9a to 9c. When $V_D>0$ and $V_G>0$, the state is on, and the gate voltage $V_G$ strongly influences the Schottky junction in the surface portion to reduce the thickness of the Schottky barrier, that is, to make the triangular potential sharp. As a result, as shown in FIG. 9c, the tunnel current flows from the Schottky metals 13 to the low concentration region 11. In this embodiment, since the drain region 25 is arranged on the back surface of the $n^+$-type semiconductor substrate 24, i.e., the rear surface of the semiconductor wafer and the source equivalent regions and the gate electrodes 15 of the cells 30 are arranged in high density on the front surface side, the current paths are increased to realize the low on resistance.

In this embodiment, the $n^+$-type semiconductor substrate 24 may be replaced by a $p^+$-type semiconductor substrate. In such a case, in the continuity such as $V_0>0$, a minority carrier is injected into the low concontration region 11 to effect the conductivity modulation, resulting in realizing a lower on-resistance. In particular, when a blocking voltage of more than 100 V is to be obtained, the resistance of the low concentration region 11 is dominant to the on-resistance of the device. Hence, when the $n^+$-type substrate 24 is replaced by the $p^+$-type substrate, the low on-resistance can be effectively obtained.

A method for producing the Schottky tunnel transistor shown in FIG. 6 will be described in connection with FIGS. 10a to 10g. In this instance, performance such as a drain-source blocking voltage $\geq 100$ V and a gate withstanding voltage $\geq 20$ V can be satisfied.

In FIG. 10a, an $n^-/n^+$ wafer having an $n^-$-type low concentration silicon region of 1.5 Ωcm, 15 μm and an $n^-$-type silicon substrate 24 of 0.01 Ωcm, 600 μm is prepared, and its surface is thermally oxidized to form a silicon oxide ($SiO_2$) film having a thickness of 6000 Å. Then, a $p^+$-type field ring 29 is formed in the surface area of the low concentration region 11 by selective diffusion so that its $p^+$-type surface concentration is approximately $10^{19}/cm^3$, $xj=5$ μm.

In FIG. 10b, the silicon oxide film in the active area is photo-etched, and a new silicon oxide film for forming gate insulating films 14 of approximately 1000 Å is grown on the photo-etched portion by the oxidation.

In FIG. 10c, a polycrystalline silicon film having a thickness of 6000 Å for forming gate electrodes 15 is deposited on the silicon oxide film, and then another silicon oxide film of 1000 Å for forming insulating films 17 is grown on the polycrystalline silicon film. Then, a $Si_3N_4$ masking film 32 having a thickness of 500 Å is formed on the silicon oxide film formed on the polycrystalline silicon film. Then, the obtained laminate film of the polycrystalline silicon film is patterned by dry etching, and then thermal oxidation of the side walls of the patterned polycrystalline silicon film is again carried out in the same manner as described above to form the silicon oxide films 17 having a thickness of 1000 Å on the side walls of the polycrystalline silicon film to obtain the insulated gates including the gate electrode 15 therein.

In FIG. 10d, a silicon oxide film having a thickness of approximately 5000 Å is deposited on the entire surface of the substrate 11 by the CVD method, and then the silicon oxide film formed by the CVD method is removed except gate side wall insulating films 18 by the RIE (reactive ion etching) method.

In FIG. 10c, by using the the gate side wall insulating films 18 and the insulated gates including the gate electrodes 15 therein as the mask, the boron ion $B^-$ is doped in the surface of the substrate 11 to form a $p^+$-type shield diffusion layer 16 having a surface concentration of approximately $10^{19}/cm^3$, $xj=3$ μm in the surface area of the substrate 11.

In FIG. 10f, by using the gate side wall insulating films 18 as the mask, an opening is formed in the thin silicon oxide film 14 above the shield diffusion layer 16, and from the opening a hollow is formed in the surface area of the substrate 11 by using the isotropic etching so as to transversely scoop out a volume right under the gate electrodes 15 in contact with the gate insulating films 14.

In FIG. 10g, a Schottky metal 13 such as tungston is selectively grown in the etched hollow. Alternatively, in this Schottky metal deposition step, by properly controlling the growing conditions, the Schottky metal 13 may be deposited so as to project transversely into the substrate 11 right under the gate electrode 15 and the gate insulating film 14. In this case, the hollow etching step in the substrate 11 in FIG. 10f is unnecessary.

Then, a PSG film as an interlayer insulating film 21 is deposited over the entire surface of the device, and contact holes are opened in the PSG film. A wiring metal such as aluminum is deposited on the PSG film by vapor deposition, and a patterning of the wiring metal is carried out to form a source electrode and a gate electrode pad. A metal is also formed on the back surface of the $n^+$-type semiconductor substrate 24 by vapor deposition to form the drain electrode, thereby obtaining a Schottky tunnel transistor shown in FIG. 6.

In FIG. 11, there is shown the third embodiment of the Schottky tunnel transistor according to the present invention, having a similar structure to that of the second embodiment shown in FIG. 6. In this embodiment, a plurality of gate electrodes 15 having a rectangular vertical cross section are formed in parallel in a groove form at a certain interval, and the lower portions of the gate electrodes 15 are buried in an n-type low concentration region 11. The gate electrodes 15 are surrounded by gate insulated films 14 and insulating films 17 in the same manner as in the second embodiment. Schottky metals 13 having a rectangular vertical cross section are arranged between the adjacent two gate electrodes 15 through the gate insulating films 14 formed thereon at the middle height of the gate electrodes 15 so that the bottoms of the Schottky metals 13 are contacted to the surface of the low concentration region 11. The bottoms of the Schottky metals 13 are shielded by $p^+$-type shield diffusion layers 16 interposed between the Schottky metals 13 and the low concentration region 11 except channel regions close to the gate electrodes 15.

In the first and second embodiments, as described above, the Schottky metals 13 are formed to project transversely into the substrate or low concentration region 11 right under the gate electrodes 15 and the gate insulating films 14 formed thereon, and hence stress is liable to be given to the gate electrodes 15 and the Schottky metals 13. On the other hand, in the third embodiment, the stress can be released in the vertical direction to reduce the influence of the stress.

FIGS. 12a and 12b illustrate the essential part of the fourth embodiment of the Schottky tunnel transistor according to the present invention, having a similar structure to the one shown in FIG. 4. In this embodiment, as shown in FIG. 12a, the Schottky metal 13 is formed to project transversely into the semiconductor substrate 11 right under the gate electrode 15 and the gate insulating film 14, and the shield diffusion layer 16 contacts with the entire bottom surface of the Schottky metal 13 to form only a vertical channel region of the Schottky junction between the Schottky metal 13 and the substrate 11. In this case, there is no offset between the gate electrode 15 and the Schottky junction. Thus, the thickness of the Schottky barrier can be effectively modulated by the gate voltage, and the leak path can be exactly cut off by the shield diffusion layer 16 to further reduce the leak current.

In FIG. 12b, the shield diffusion layer 16 further covers the lower corner of the Schottky metal 13 in the substrate 11. The electric field is apt to concentrate on the corner portion of the Schottky metal 13. In this case, since the corner portion of the Schottky metal 13 is covered by the shield diffusion layer 16, the leak path of the corner portion of the Schottky metal 13 is cut off by the shield diffusion layer 16, thereby largely improving the leak current reduction efficiency.

What is claimed is:

1. A semiconductor device, comprising:
    a semiconductor substrate of a first conductivity type, the substrate having a first surface;
    a drain region located in the substrate;
    a gate electrode located on the first surface of the substrate via an insulating film located between the gate electrode and the first surface;
    a Schottky metal located as a source region in the first surface of the substrate away from the drain region, the Schottky metal and the substrate constituting a Schottky junction at an interface between the Schottky metal and the substrate near the gate electrode, a part of the Schottky junction constituting a channel equivalent region where the gate electrode controls a tunnel current; and
    a shield layer of a second conductivity type different from the first conductivity type, the shield layer being interposed between the Schottky metal and the substrate except at the channel equivalent region.

2. The device of claim 1, wherein the drain region is located in the first surface of the substrate, and the gate electrode is located on the first surface of the substrate via the insulating film between the drain region and the Schottky metal.

3. The device of claim 1, wherein the substrate includes a second surface, and the drain region is located on the second surface of the substrate.

4. The device of claim 1, wherein the Schottky metal projects into the substrate right under the gate electrode.

5. The device of claim 1, wherein the Schottky metal includes a bottom surface and at least one side surface, and the bottom surface of the Schottky metal is entirely covered by the shield layer.

6. The device of claim 1, wherein the Schottky metal is arranged on an intermediate portion of a side wall of the gate electrode via the insulating film, and wherein the Schottky junction is located between a bottom of the Schottky metal and the substrate near the gate electrode, and the bottom of the Schottky metal is covered by the shield layer except at the channel equivalent region.

7. The device of claim 1, wherein the Schottky metal includes a bottom surface and at least one side surface, and the bottom and side surface intersect at a corner, and wherein the shield layer covers the bottom surface and a corner portion of the Schottky metal in the substrate.

8. A semiconductor device, comprising:
    a semiconductor substrate of a first conductivity type, the substrate having a first surface;
    a drain region located in the substrate; and
    a plurality of groups of cells, each cell including a plurality of units, each unit including
    a gate electrode located on the first surface of the substrate via an insulating film located between the gate electrode and the first surface;
    a Schottky metal located as a source region in the first surface of the substrate away from the drain region, the Schottky metal and the substrate constituting a Schottky junction at an interface between the Schottky metal and the substrate near the gate electrode, a part of the Schottky junction constituting a channel equivalent region where the gate electrode controls a tunnel current; and
    a shield layer of a second conductivity type different from the first conductivity type, the shield layer being interposed between the Schottky metal and the substrate except at the channel equivalent region.

9. The device of claim 8, wherein each group of cells is surrounded by at least one field ring.

* * * * *